(12) United States Patent
Konishi et al.

(10) Patent No.: US 8,421,088 B2
(45) Date of Patent: Apr. 16, 2013

(54) SURFACE MOUNTING TYPE LIGHT EMITTING DIODE

(75) Inventors: Masahiro Konishi, Ikoma (JP); Toshio Hata, Mihara (JP); Taiji Morimoto, Onomichi (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 614 days.

(21) Appl. No.: 12/035,320

(22) Filed: Feb. 21, 2008

(65) Prior Publication Data

US 2008/0203417 A1   Aug. 28, 2008

(30) Foreign Application Priority Data

Feb. 22, 2007  (JP) ................................ 2007-042686
Dec. 28, 2007  (JP) ................................ 2007-339963

(51) Int. Cl.
   *H01L 33/00*   (2010.01)
(52) U.S. Cl.
   USPC .............. 257/79; 257/91; 257/95; 257/98; 257/99; 257/100
(58) Field of Classification Search ............ 257/79, 257/81, 95, 99, 100, 91, 98
   See application file for complete search history.

(56) References Cited

U.S. PATENT DOCUMENTS

| | | | |
|---|---|---|---|
| 4,742,432 A | 5/1988 | Thillays et al. | |
| 4,907,044 A | 3/1990 | Schellhorn et al. | |
| 6,198,901 B1 * | 3/2001 | Watanabe | 399/328 |
| 6,301,035 B1 | 10/2001 | Schairer | |
| 6,495,861 B1 | 12/2002 | Ishinaga | |
| 6,707,069 B2 | 3/2004 | Song et al. | |
| 6,747,293 B2 | 6/2004 | Nitta et al. | |
| 6,909,123 B2 * | 6/2005 | Hayashimoto et al. | 257/98 |
| 2002/0080622 A1 | 6/2002 | Pashley et al. | |
| 2002/0190262 A1 | 12/2002 | Nitta et al. | |

(Continued)

FOREIGN PATENT DOCUMENTS

| | | |
|---|---|---|
| CN | 85104012 | 9/1986 |
| CN | 2544416 | 4/2003 |

(Continued)

OTHER PUBLICATIONS

Acccuratus Alumina Materials Properties (www.accuratus.com/pdf/94aluminaprops.pdf).*

(Continued)

*Primary Examiner* — Ha Tran T Nguyen
*Assistant Examiner* — Suberr Chi
(74) *Attorney, Agent, or Firm* — Morrison & Foerster LLP

(57) ABSTRACT

This invention provides a surface mounting type light emitting diode excellent in heat radiation performance, reliability and productivity. The surface mounting type light emitting diode includes an insulating base member, a semiconductor light emitting element having a bottom face fixedly bonded to a top face of the base member, and a metallic reflector joined to the top face of the base member with a heat conduction type adhesive sheet interposed therebetween, to surround the semiconductor light emitting element. Heat generated from the semiconductor light emitting element is transferred to the reflector via the base member and the heat conduction type adhesive sheet, and then is radiated to the outside. The metallic reflector can efficiently radiate the heat to the outside. The cutting margin provided for the reflector facilitates a dicing process, which improves productivity.

17 Claims, 12 Drawing Sheets

U.S. PATENT DOCUMENTS

| | | | |
|---|---|---|---|
| 2003/0022407 A1* | 1/2003 | Sakamoto et al. | 438/22 |
| 2004/0056265 A1 | 3/2004 | Arndt et al. | |
| 2004/0065894 A1 | 4/2004 | Hashimoto et al. | |
| 2004/0129945 A1 | 7/2004 | Uemura | |
| 2004/0201987 A1 | 10/2004 | Omata | |
| 2004/0211970 A1 | 10/2004 | Hayashimoto et al. | |
| 2004/0256630 A1* | 12/2004 | Cao | 257/98 |
| 2005/0051782 A1* | 3/2005 | Negley et al. | 257/79 |
| 2005/0073846 A1 | 4/2005 | Takine | |
| 2005/0133939 A1 | 6/2005 | Chikugawa et al. | |
| 2006/0102917 A1* | 5/2006 | Oyama et al. | 257/99 |
| 2006/0145343 A1* | 7/2006 | Lee et al. | 257/737 |
| 2006/0157722 A1 | 7/2006 | Takezawa et al. | |
| 2006/0226437 A1* | 10/2006 | Fujita et al. | 257/98 |
| 2006/0244127 A1* | 11/2006 | Holalkere et al. | 257/706 |
| 2006/0267042 A1 | 11/2006 | Izuno et al. | |
| 2007/0007540 A1 | 1/2007 | Hashimoto et al. | |
| 2007/0007558 A1 | 1/2007 | Mazzochette | |
| 2008/0012036 A1* | 1/2008 | Loh et al. | 257/99 |
| 2008/0191620 A1 | 8/2008 | Moriyama et al. | |
| 2008/0197274 A1* | 8/2008 | Harder | 250/238 |
| 2008/0203416 A1 | 8/2008 | Konishi et al. | |
| 2009/0315059 A1 | 12/2009 | Fujita et al. | |

FOREIGN PATENT DOCUMENTS

| | | |
|---|---|---|
| CN | 1466782 A | 1/2004 |
| CN | 1538538 A | 10/2004 |
| JP | 51-124388 A | 10/1976 |
| JP | 59-207674 | 11/1984 |
| JP | 6-77540 | 3/1994 |
| JP | 11-040859 A | 2/1999 |
| JP | 11-46018 | 2/1999 |
| JP | 11-87780 | 3/1999 |
| JP | 2000-58924 | 2/2000 |
| JP | 2000-77725 | 3/2000 |
| JP | 2000-216443 | 8/2000 |
| JP | 2000-269551 | 9/2000 |
| JP | 2000-294838 | 10/2000 |
| JP | 2002-222998 | 8/2002 |
| JP | 2003-197974 | 7/2003 |
| JP | 2004-111909 | 4/2004 |
| JP | 2004-516666 | 6/2004 |
| JP | 2004-193357 | 7/2004 |
| JP | 2004-311917 A | 11/2004 |
| JP | 2004-327863 | 11/2004 |
| JP | 2004-327955 | 11/2004 |
| JP | 2005-12155 | 1/2005 |
| JP | 2005-39100 | 2/2005 |
| JP | 2005-175389 A | 6/2005 |
| JP | 2005-183531 | 7/2005 |
| JP | 2005-283563 | 10/2005 |
| JP | 2006-165138 | 6/2006 |
| JP | 2006-186297 | 7/2006 |
| JP | 2006-294804 | 10/2006 |
| KR | 2002-0079516 | 10/2002 |
| KR | 10-2004-0092512 | 11/2004 |
| WO | WO-02/05351 A1 | 1/2002 |
| WO | WO-03/030274 | 4/2003 |

OTHER PUBLICATIONS

U.S Office Action mailed on Dec. 12, 2008, directed to related U.S. Appl. No. 11/400,664; 13 pages.

Extended European Search Report mailed on Aug. 14, 2006 for related European Patent Application No. 06007421.8, (4 pages).

Chinese Office Action dated Jun. 8, 2007, directed to related CN Application No. 200610073239.7, (20 pages).

U.S. Office Action, mailed Jun. 11, 2008, directed to related U.S. Appl. No. 11/400,664. 9 pages.

Chinese Office Action dated Oct. 30, 2009, directed to corresponding Chinese Patent Application No. 200810074071.0; 17 pages.

Fujita et al., U.S. Office Action mailed May 4, 2010, directed towards U.S. Appl. No. 12/548,112; 9 pages.

Japanese Decision for Dismissal of Amendment, mailed Jan. 5, 2011, directed to Japanese Patent Application No. 2005-112292; 5 pages.

Konishi, M. et al., U.S. Office Action mailed Aug. 31, 2010, directed to U.S. Appl. No. 12/035,216; 17 pages.

Fujita et al.; U.S. Office Action mailed Oct. 18, 2010, directed to U.S. Appl. No. 12/548,112; 10 pages.

Konishi, M. et al., U.S. Office Action mailed Dec. 30, 2010, directed to U.S. Appl. No. 12/035,216; 18 pages.

Notice of Grounds of Rejection mailed Feb. 14, 2012, directed to Japanese Application No. 2007-339975; 9 pages.

* cited by examiner

SURFACE MOUNTING TYPE LIGHT EMITTING DIODE

This nonprovisional application is based on Japanese Patent Application(s) No(s). 2007-042686 and 2007-339963 filed with the Japan Patent Office on Feb. 22, 2007 and Dec. 28, 2007, respectively, the entire contents of which are hereby incorporated by reference.

BACKGROUND OF THE INVENTION

1. Field of the Invention

The present invention relates to a surface mounting type light emitting diode. In particular, the present invention relates to a surface mounting type light emitting diode attaching importance to heat radiation performance, reliability and productivity, and to a method for manufacturing the same.

2. Description of the Background Art

A semiconductor light emitting element emits visible light or near infrared light in such a manner that a PN junction is formed on an AlInGaP compound semiconductor wafer or a GaN compound semiconductor wafer and forward electric current is fed to the PN junction. In recent years, the semiconductor light emitting element has been widely adopted for use in display, communication, measurement, control and the like. Further, the semiconductor light emitting element tends to be used in a field of automotive components requiring good heat radiation performance and high reliability. There has been also developed a surface mounting type light emitting diode for satisfying such requirements. Examples of such a conventional surface mounting type light emitting diode are disclosed in Japanese Patent Laying-Open Nos. 2006-165138, 2005-183531 and 2003-197974.

As shown in FIG. 19, a conventional surface mounting type light emitting diode 100 includes a chip substrate 101, an LED chip 102 mounted on chip substrate 101, a frame-shaped member 103 formed on chip substrate 101 so as to surround LED chip 102, and a molding resin 104 applied into a recess of frame-shaped member 103.

Chip substrate 101 is a flat and copper-clad wiring substrate, and is made of a heat resistant resin. Chip substrate 101 has, at a surface thereof, a chip mount land 105, a connection land 107, and surface mounting terminals 106 extending from the surface to a bottom face via both end edges. LED chip 102 is joined to a top face of chip mount land 105 of chip substrate 101. Further, LED chip 102 is electrically connected to connection land 107, which is adjacent thereto, by a wire bonding process.

Molding resin 104 is a transparent material such as an epoxy resin, and is applied and cured in the recess of frame-shaped member 103. Chip substrate 101 includes an upper substrate and a lower substrate, that is, has a double-layer structure, which is formed by an Any Layer AGSP (Advanced Grade Solid-bump Process), for example.

As shown in FIG. 20, another conventional surface mounting type light emitting diode 200 includes a lead frame 201, a semiconductor light emitting element 202, a sealing member 203 and a reflector 205. Lead frame 201 has a plurality of lead terminals 204a and a plurality of lead terminals 204b. Semiconductor light emitting element 202 is die-bonded to lead frame 201. Sealing member 203 seals lead frame 201 such that the plurality of lead terminals 204a, the plurality of lead terminals 204b and semiconductor light emitting element 202 are bared. Reflector 205 is attached to sealing member 203 to direct light emitted from semiconductor light emitting element 202 to a certain direction.

Of the plurality of lead terminals, predetermined lead terminal 204a connected to lead frame 201 having semiconductor light emitting element 202 die-bonded thereto is disposed on a side where reflector 205 is placed, and is connected to reflector 205. With this configuration, predetermined lead terminal 204a connected to a portion, to which semiconductor light emitting element 202 is die-bonded, is connected to reflector 205. Thus, heat generated from semiconductor light emitting element 202 is transferred with certainty to reflector 205 via predetermined lead terminal 204a. As a result, the heat transferred to reflector 205 can be efficiently radiated by reflector 205.

In addition, there has been proposed a semiconductor light emitting device for transferring heat generated from a light emitting element to a reflector via a ceramic substrate having a good heat conductivity in order to perform heat radiation.

With regard to heat radiation performance, in conventional surface mounting type light emitting diode 100 shown in FIG. 19, the chip is mounted on small chip mount land 105 and is connected to an electric conductive pattern provided therebelow in a stepwise manner. Chip mount land 105 is small in size, and heat is radiated via electric conductive pattern 108. Consequently, this configuration causes a problem that the heat radiation is unsatisfactory. Furthermore, frame-shaped member 103 of surface mounting type light emitting diode 100 is made of a heat resistant resin. Consequently, this configuration causes a problem that heat radiation performance of frame-shaped member 103 is poor.

With regard to a structure, chip substrate 101 includes an upper substrate and a lower substrate, that is, has a double-layer structure. According to this structure, chip substrate 101 is electrically connected to surface mounting terminal 106, which extends from the top face to the bottom face, with connection land 107 and electric conductive pattern 108 interposed therebetween. In chip substrate 101, consequently, the substrates forming a multilayered substrate must be penetrated successively in order to achieve electric conduction to the lower substrate, which results in a complicated wiring connection pattern.

In conventional surface mounting type light emitting diode 200 shown in FIG. 20, on the other hand, lead terminal 204a connected to the portion, to which semiconductor light emitting element 202 is die-bonded, is connected to reflector 205. This contact area is small, which causes a problem that the heat generated from semiconductor light emitting element 202 can not be transferred with certainty to reflector 205 via lead terminal 204a. In addition, reflector 205 on sealing member 203 made of resin is formed into a plate shape. Consequently, there is a possibility that the heat can not be radiated satisfactorily and efficiently. As a result, this configuration causes a problem that the heat transferred to reflector 205 can not be efficiently radiated by reflector 205.

SUMMARY OF THE INVENTION

A principal object of the present invention is to provide a surface mounting type light emitting diode excellent in heat radiation performance, reliability and productivity, and a method for manufacturing the same.

The surface mounting type light emitting diode according to the present invention includes: an insulating base member; a semiconductor light emitting element having a bottom face fixedly bonded to a top face of the base member; and a metallic reflector joined to the top face of the base member with an insulating adhesive sheet interposed therebetween, so as to surround the semiconductor light emitting element.

In this case, heat generated from the semiconductor light emitting element is transferred to the reflector via the base member and the adhesive sheet, and then is radiated from the reflector to the outside. In addition, the heat is partially radiated to the outside via the base member. The metallic reflector can efficiently radiate the heat generated from the semiconductor light emitting element to the outside. In addition, the metallic reflector can efficiently release light emitted from the semiconductor light emitting element to the outside. The reflector may be made of a combination of different kinds of metal. For example, the reflector may have a configuration that on a surface of a metal material, different metal is laminated by a plating process. More preferably, the reflector is made of a single material, which facilitates manufacturing of the reflector and improves productivity. If the reflector is made of the single material, this single material may be not only one kind of metal, but also an alloy.

Desirably, the reflector has a projection formed at an outer peripheral face thereof, and the projection has a width smaller than a width of the outer peripheral face. The reflector is made of metal. Therefore, if the reflector has a large thickness, a dicing process is hard to be performed on the reflector. Upon formation of the reflector from a plate material, a region which is thinner in thickness than the plate material is provided as a cutting margin. This region facilitates the dicing process, which improves productivity without reducing yield of a surface mounting type light emitting diode. A shape of the diced cutting margin corresponds to the projection. The projection increases a surface area of the reflector, which achieves more efficient heat radiation.

Moreover, the reflector may have a plurality of projections each equal to the foregoing projection at the outer peripheral face thereof. In this case, the heat radiation from the reflector to the outside is accelerated, which further improves heat radiation performance.

Desirably, the base member is made of at least any one of a glass epoxy, an alumina (an aluminum oxide), an epoxy, a polyimide and AlN, or a complex thereof. These materials are inexpensive and are readily subjected to processing. Therefore, the base member made of one of these materials can be readily obtained by a dicing process.

Desirably, the reflector is made of at least any one of Al, Cu, Fe and Mg, or a complex thereof. These materials are high in heat conductivity. Therefore, the reflector made of one of these materials can efficiently radiate heat generated from the semiconductor light emitting element to the outside. In addition, since these materials are readily subjected to processing, the reflector can be fabricated readily.

Desirably, the surface mounting type light emitting diode according to the present invention further includes a translucent resin provided on the base member so as to cover the semiconductor light emitting element and to come into no contact with the reflector. In this case, the translucent resin covers the semiconductor light emitting element to prevent circuitry from being exposed to outside air, and comes into no contact with the reflector. This configuration eliminates occurrence of a problem that heat transferred from the semiconductor light emitting element to the translucent resin causes expansion and shrinkage of the translucent resin so that the translucent resin is separated from the reflector. This configuration also eliminates occurrence of a problem that the translucent resin is separated from the reflector due to expansion and shrinkage of the base member, which reduces a possibility of failure of the surface mounting type light emitting diode and improves reliability. Herein, the material for the base member may be different in coefficient of thermal expansion from the material for the reflector.

Desirably, the translucent resin contains a fluorescent material excited by light released from the semiconductor light emitting element to emit light longer in wavelength than the light released from the semiconductor light emitting element. For example, the semiconductor light emitting element is a blue semiconductor light emitting element made of a gallium nitride-based compound semiconductor. Desirably, the translucent resin contains a fluorescent material excited by light released from the blue semiconductor light emitting element to emit yellow light. This configuration allows provision of a white light source. Herein, the semiconductor light emitting element may be made of a ZnO (zinc oxide)-based compound semiconductor. Further, the semiconductor light emitting element may be configured to emit near UV light.

Desirably, the surface mounting type light emitting diode according to the present invention further includes a plurality of semiconductor light emitting elements each equal to the foregoing semiconductor light emitting element. In this case, a high power light source can be realized. If a blue LED chip, a green LED chip and a red LED chip are mounted as the plurality of semiconductor light emitting elements, a light source to be realized can perform toning of white light by adjustment of an amount of electric current to be fed to each LED chip, Herein, a plurality of blue LED chips, a plurality of green LED chips and a plurality of red LED chips may be mounted as the plurality of semiconductor light emitting elements.

Desirably, the adhesive sheet is a heat conduction type adhesive sheet. In this case, the adhesive sheet has a relatively high heat conductivity (e.g., 1.0 W/m·K or more) representing a degree of heat transfer in one substance. Therefore, heat is readily transferred from the adhesive sheet to the metallic reflector. Thus, heat generated from the semiconductor light emitting element can be efficiently radiated to the outside. In addition, since the reflector can be bonded to the base member through the heat conduction type adhesive sheet, the surface mounting type light emitting diode can be manufactured readily.

Desirably, the translucent resin and the heat conduction type adhesive sheet come into contact with each other. In this case, heat generated from the semiconductor light emitting element and then radiated to the translucent resin can be transferred to the metallic reflector via the heat conduction type adhesive sheet, which realizes more efficient heat radiation.

Desirably, the heat conduction type adhesive sheet is made of at least any one of a heat conductive silicone, a heat conductive acryl and a heat conductive epoxy, or a complex thereof. These materials are high in heat conductivity, which can efficiently radiate heat generated from the semiconductor light emitting element and then radiated to the translucent resin. Herein, the heat conduction type adhesive sheet is filled with a heat conductive filler, and examples of the heat conductive filler may include a silicon oxide, an aluminum oxide, a magnesium oxide, an aluminum hydroxide and the like each having a good heat conductivity. As the heat conduction type adhesive sheet, alternatively, it may be considered that a heat conduction type viscous material, an aluminum foil and a heat conduction type viscous material are laminated in this order to form a sheet or a heat conduction type viscous material, a heat conductive compound and a heat conduction type viscous material are laminated in this order to form a sheet.

Desirably, the reflector has an inner circumferential face formed into a part of any one of a conical face, a spherical face and a paraboloidal face. In this case, light emitted from the semiconductor light emitting element can be released efficiently.

Desirably, at least the top face of the base member, to which the semiconductor light emitting element is fixedly bonded, is subjected to gold plating or silver plating. In this case, a bonding process for fixedly bonding the semiconductor light emitting element to the base member becomes favorable. In addition, the silver plating brings a high light reflectivity, which improves efficiency for releasing light emitted from the semiconductor light emitting element toward the base member.

Desirably, the top face of the base member is subjected to gold plating or silver plating to form a conductor layer electrically connected to the semiconductor light emitting element. In this case, the conductor layer can be prevented from being altered.

The reflector may have an irregular bonding face to the base member. Alternatively, the reflector may have a sawtoothed bonding face to the base member. In this case, heat conduction from the adhesive sheet to the reflector is improved. Accordingly, heat generated from the semiconductor light emitting element can be efficiently radiated to the outside. Moreover, a joining strength of the reflector can be enhanced.

In addition, the adhesive sheet may extend inwardly with respect to the inner circumferential face of the reflector. In this case, heat generated from the semiconductor light emitting element is transferred to the reflector via the adhesive sheet and the conductor layer and, therefore, can be radiated more efficiently.

The method for manufacturing the surface mounting type light emitting diode according to the present invention includes the steps of: forming a plurality of through holes and a plurality of trenches for cutting, on a metallic reflector workpiece; joining the reflector workpiece onto an insulating base member aggregate with a heat conduction type adhesive sheet interposed therebetween, fixedly bonding a plurality of semiconductor light emitting elements onto the base member aggregate at positions inside the plurality of through holes; and dicing the reflector workpiece and the base member aggregate along the trench to obtain a surface mounting type light emitting diode having a single base member and a single reflector.

In this case, the metallic reflector can efficiently radiate heat generated from the semiconductor light emitting element to the outside. In addition, the metallic reflector can efficiently release light emitted from the semiconductor light emitting element to the outside. If the metallic reflector has a large thickness, a dicing process is hard to be performed on the reflector. In order to eliminate this disadvantage, the trench for cutting is formed on the reflector workpiece. This trench facilitates the dicing process, which improves productivity without reducing yield of a surface mounting type light emitting diode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
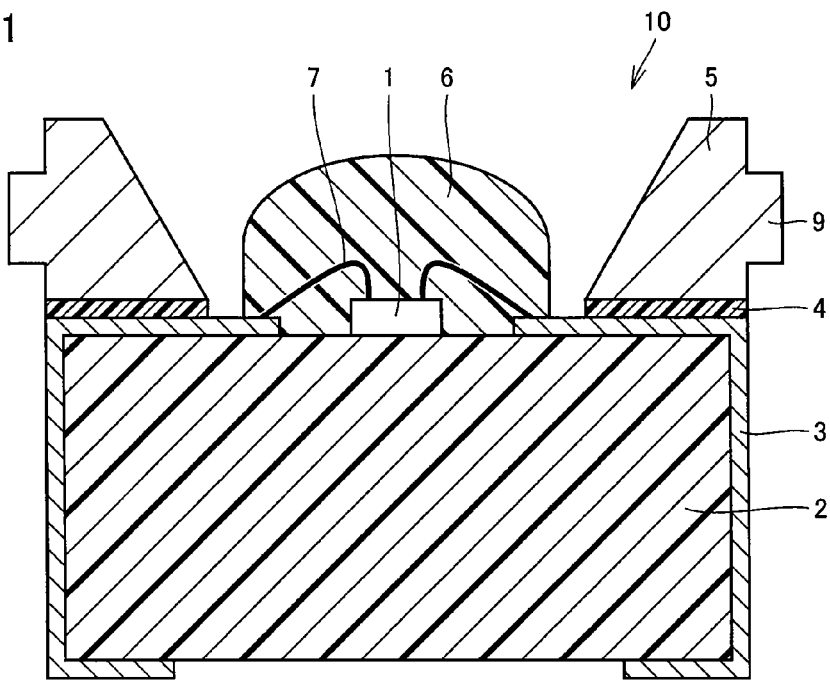
FIG. 1 schematically shows a part of a sectional structure of a surface mounting type light emitting diode according to a first embodiment of the present invention.

With reference to the drawings, hereinafter, description will be given of preferred embodiments of the present invention. In the respective drawings, identical or corresponding components are denoted by identical reference numerals; therefore, repetitive description thereof will not be given.

First Embodiment

As shown in FIG. 1, a surface mounting type light emitting diode 10 includes a semiconductor light emitting element 1, a base member 2, a conductor layer 3, a heat conduction type adhesive sheet 4, a reflector 5 provided with a projection 9, a fluorescent material-containing translucent resin 6 and an electric conductive wire 7.

Base member 2 is made of a glass epoxy, and is formed into a plate shape. Semiconductor light emitting element 1 has a bottom face fixedly bonded to a top face of base member 2.

On the top face of base member 2, that is, a surface to which semiconductor light emitting element 1 is fixedly bonded, conductor layer 3 is laminated to serve as a metal wiring pattern conductor. Heat conduction type adhesive sheet 4 having an insulating property is laminated on a part of conductor layer 3, and reflector 5 is provided on heat conduction type adhesive sheet 4. In other words, reflector 5 is joined to the top face of base member 2 with heat conduction type adhesive sheet 4 interposed therebetween, so as to surround semiconductor light emitting element 1.

Reflector 5 is made of aluminum (Al), and is formed into a bowl shape (a minimum inner diameter: approximately 2 mm, a maximum inner diameter: approximately 3 mm). Projection 9 provided on an outer peripheral face of reflector 5 is a residue of a cutting margin used for facilitation of a dicing process. Projection 9 has a width smaller than a width of the outer peripheral face of reflector 5. This width indicates a dimension in a direction perpendicular to the top face of base member 2 (i.e., the surface to which semiconductor light emitting element 1 is fixedly bonded). As shown in FIG. 1, more specifically, the dimension of projection 9 in a thickness direction of reflector 5 (a vertical direction in FIG. 1) is smaller than a thickness of reflector 5 in a cross section of reflector 5. Moreover, an inner circumferential wall of reflector 5 is subjected to a mirror finish. Since reflector 5 is formed into the bowl shape and the inner circumferential wall thereof is subjected to the mirror finish, light emitted from semiconductor light emitting element 1 is reflected by reflector 5, and then is efficiently released to the outside.

On the top face of base member 2, moreover, semiconductor light emitting element 1 is mounted at a position inward with respect to reflector 5. Semiconductor light emitting element 1 is covered with translucent resin 6 made of a silicone resin. Translucent resin 6 contains a fluorescent material excited by light from semiconductor light emitting element 1 to emit yellow light. The fluorescent material is dispersed in and held by translucent resin 6.

Semiconductor light emitting element 1 is a blue semiconductor light emitting element made of a gallium nitride-based compound semiconductor, and is formed into a chip shape having a P-electrode and an N-electrode provided on a single side (a top face in FIG. 1). Semiconductor light emitting element 1 emits blue light. Herein, yellow light obtained in such a manner that the fluorescent material dispersed in and held by translucent resin 6 absorbs the blue light is mixed with the blue light which is not absorbed by the fluorescent material, so that white light is obtained. Herein, translucent resin 6 may be formed into a convex lens shape bulging toward a side spaced away from the surface of base member 2. Herein, the blue light is emitted at a peak wavelength in a range from 350 nm or more to 490 nm or less. The yellow light is emitted at a peak wavelength in a range from 550 nm or more to 650 nm or less. That is, the yellow light is longer in wavelength than the blue light.

Herein, translucent resin 6 and reflector 5 come into no contact with each other. This configuration eliminates occurrence of a problem that heat generated from semiconductor light emitting element 1 causes expansion and shrinkage of translucent resin 6 so that translucent resin 6 is separated from reflector 5, which reduces a possibility of failure of surface mounting type light emitting diode 10 and improves reliability. Herein, the material for base member 2 may be different in coefficient of thermal expansion from the material for reflector 5.

Figure 2:
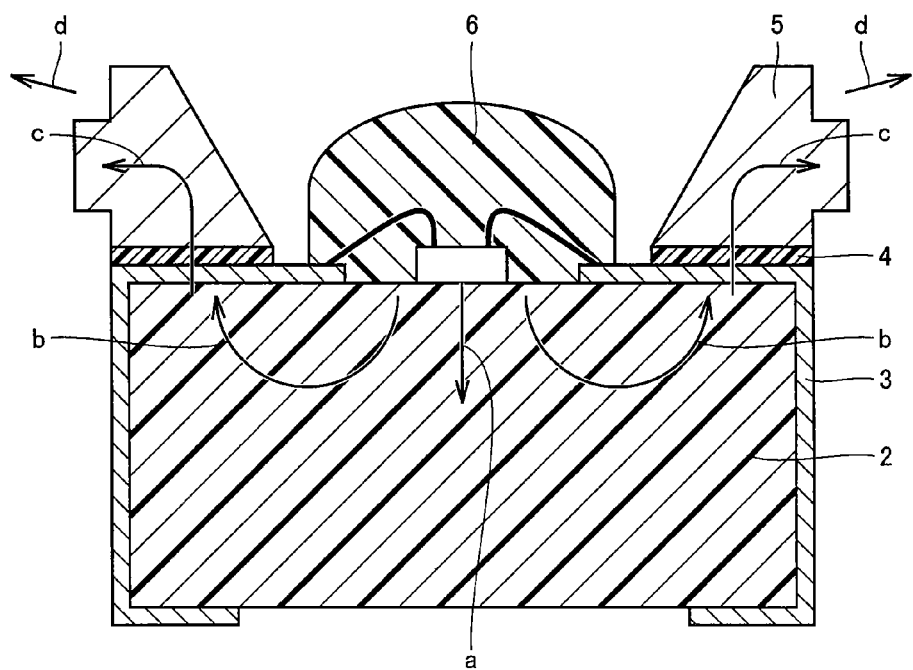
FIG. 2 schematically shows a conduction state of heat generated from a semiconductor light emitting element.

In FIG. 2, arrow marks "a", "b", "c" and "d" each denote a direction of heat conduction. As shown in FIG. 2, heat generated from semiconductor light emitting element 1 is transferred to base member 2 in the directions of arrow marks "a" and "b". The heat transferred to base member 2 is partially radiated to the outside via base member 2. The remaining heat is transferred to reflector 5 via heat conduction type adhesive sheet 4 in the directions of arrow marks "b" and "c". The heat transferred to reflector 5 is radiated to the outside in the direction of arrow mark "d".

Reflector 5 is made of Al, and has a high heat conductivity. Therefore, reflector 5 can efficiently radiate the heat generated from semiconductor light emitting element 1 to the outside. In other words, reflector 5 is excellent in heat radiation performance. Projection 9 of reflector 5 increases a surface area of reflector 5, which achieves more efficient heat radiation. Moreover, since reflector 5 is joined to base member 2 with heat conduction type adhesive sheet 4 interposed therebetween, heat is readily transferred to reflector 5 made of Al. Thus, the heat generated from semiconductor light emitting element 1 can be efficiently radiated to the outside. It is needless to say that heat conduction type adhesive sheet 4 to be used herein is excellent in heat conductivity. For example, heat conduction type adhesive sheet 4 may be made of any one of a heat conductive silicone, a heat conductive acryl and a heat conductive epoxy, or a complex thereof obtained by laminating these materials.

Since the heat generated from semiconductor light emitting element 1 can be efficiently radiated to the outside, the temperature of semiconductor light emitting element 1 is lowered, so that the temperature of translucent resin 6 for covering semiconductor light emitting element 1 is kept to be low. Therefore, translucent resin 6 can be prevented from being degraded due to a disadvantage that the fluorescent material dispersed in and held by translucent resin 6 is exposed to the high temperature of semiconductor light emitting element 1. Thus, this configuration allows prolonging of a lifetime of surface mounting type light emitting diode 10. In addition, this configuration allows suppression of variation of colors generated by surface mounting type light emitting diode 10.

The fluorescent material dispersed in and held by translucent resin 6 is at least one of a YAG (Yttrium-Aluminum-Garnet)-based fluorescent material, a BOS (Barium Ortho-Silicate)-based fluorescent material and a TAG (Terbium-Aluminum-Garnet)-based fluorescent material each having gadolinium and cerium added thereto. In order to obtain white light, translucent resin 6 must contain a fluorescent material. However, it is needless to say that semiconductor light emitting element 1 may be sealed with only translucent resin 6 containing no fluorescent material in surface mounting type light emitting diode 10. Desirably, translucent resin 6 is at least one of a silicone-based resin, an epoxy-based resin, an acryl-based resin, a fluorine-based resin, a polyimide-based resin and a silicone-modified epoxy-based resin, or a complex thereof. The heat generated from semiconductor light emitting element 1 is partially radiated to the outside via translucent resin 6. Preferably, translucent resin 6 is excellent in heat radiation performance, for example, translucent resin 6 has a heat conductivity of 0.3 W/m·K or more.

The light emitted from semiconductor light emitting element 1 is efficiently released to the outside because reflector 5 is made of metal (Al). Since reflector 5 is made of Al, the inner circumferential face of reflector 5 may not be subjected to Al deposition or metal plating so as to increase a reflectivity as a reflection layer. Therefore, reflector 5 can be fabricated readily. Moreover, surface mounting type light emitting diode 10 is manufactured only in such a manner that base member 2 and reflector 5 are bonded to each other through heat conduction type adhesive sheet 4. Therefore, surface mounting type light emitting diode 10 can be manufactured readily.

Figure 3:
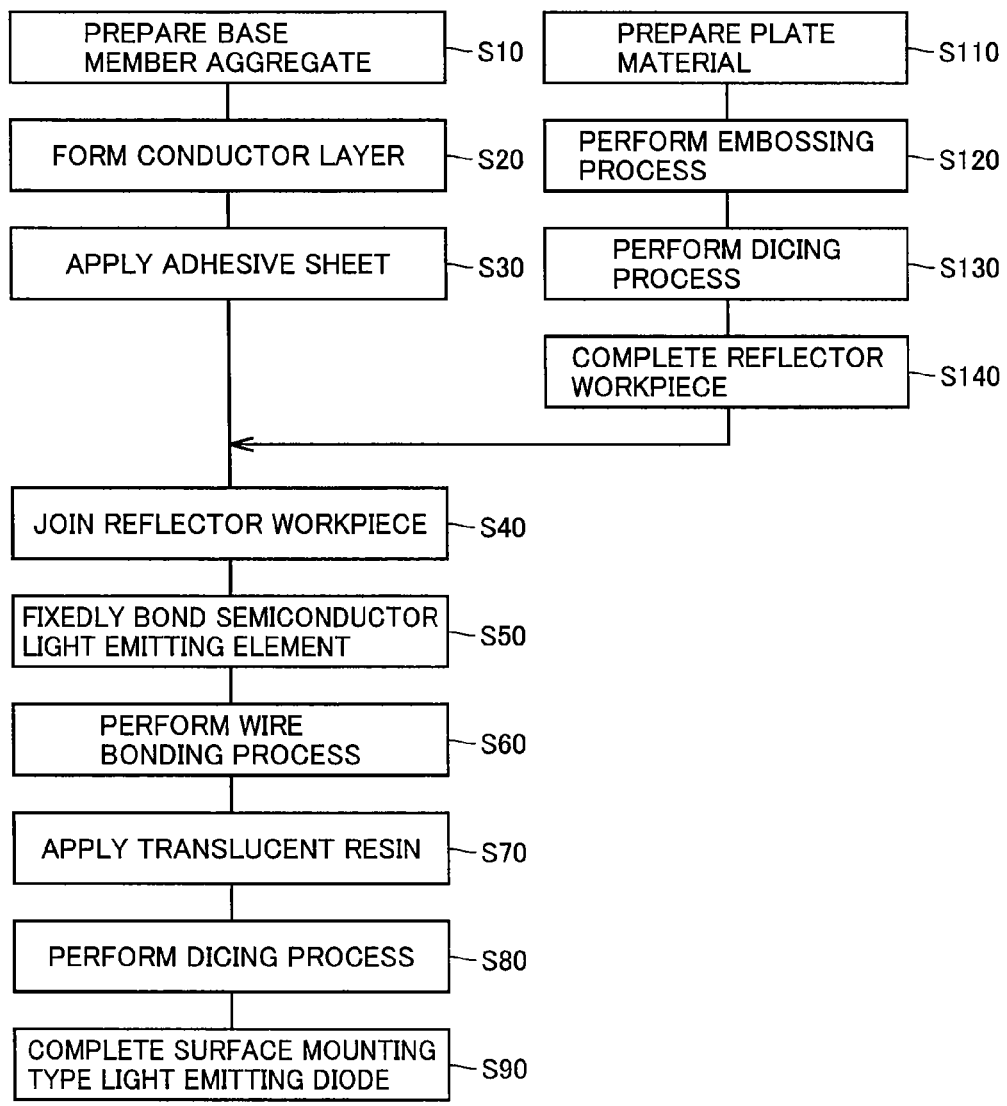
FIG. 3 is a flowchart showing a procedure of manufacturing the surface mounting type light emitting diode.

Next, description will be given of a procedure of manufacturing surface mounting type light emitting diode 10 shown in FIG. 1. As shown in FIG. 3, first, in step S10, a glass epoxy plate (a thickness. 1 mm) is prepared as a base member aggregate. Herein, the base member aggregate indicates a workpiece from which a base member 2 is obtained by a dicing process (a cutting process). As will be described later, the base member aggregate is subjected to various processes such as fixed bonding, wire bonding and resin sealing for a semiconductor light emitting element 1, and then is cut and divided into respective base members 2.

Figure 4:
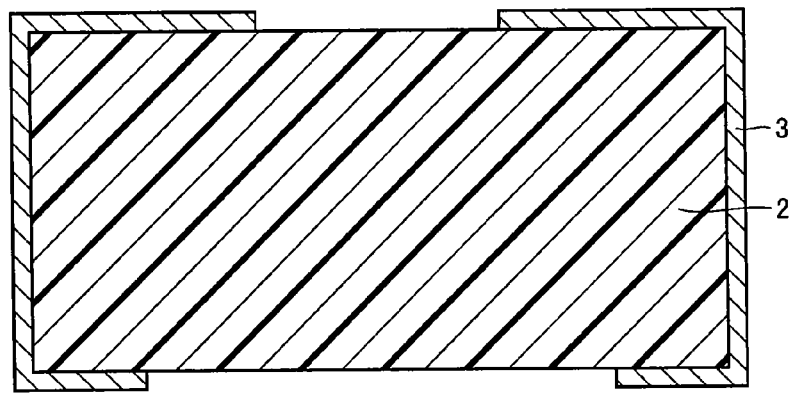
FIG. 4 schematically shows a step of forming a conductor layer.
Figure 5:
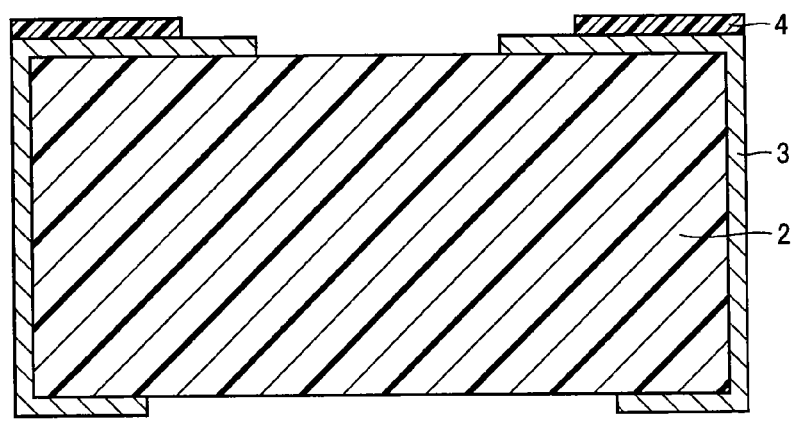
FIG. 5 schematically shows a step of applying an adhesive sheet.

As shown in FIG. 4, next, in step S20, a conductor layer 3 including a copper film (a thickness: 0.035 mm) serving as a metal wiring pattern conductor and a gold thin film (a thickness: 0.005 mm) formed by a gold plating method is laminated on a surface of the base member aggregate. A surface of conductor layer 3 is subjected to gold plating and, as a result, is coated with a gold thin film. Therefore, conductor layer 3 is prevented from being altered. As shown in FIG. 5, next, in step S30, a heat conductive acryl sheet (a thickness: 0.1 mm) is applied as a heat conduction type adhesive sheet 4 to conductor layer 3 at a top face of the base member aggregate.

Figure 9A:
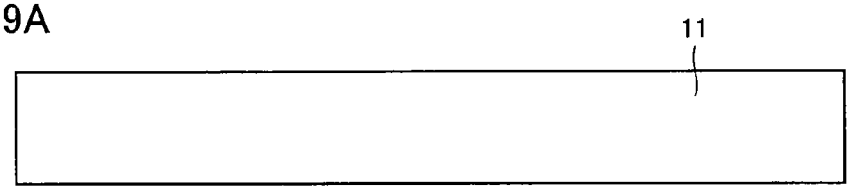
FIG. 9A is a side view of a plate material.
Figure 9B:
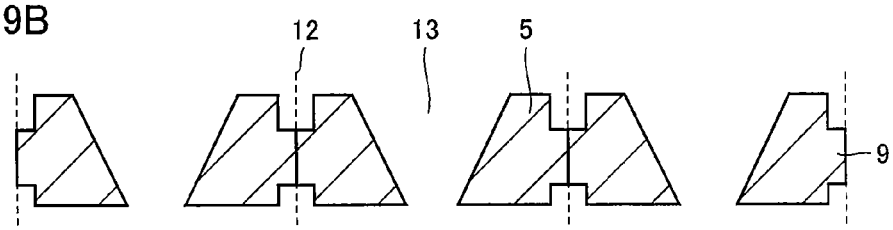
FIG. 9B is a sectional view of the plate material subjected to an embossing process.
Figure 9C:
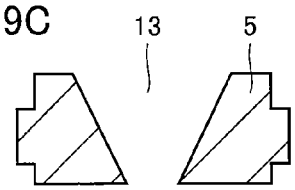
FIG. 9C is a sectional view of a reflector workpiece.

In steps S110 to S140, on the other hand, a reflector workpiece is formed. As shown in FIG. 9A, first, in step S110, an aluminum plate (a thickness: 0.8 mm) is prepared as a plate material 11. FIG. 9A shows a side face of plate material 11. In actual, a material to be prepared as plate material 11 is long in a direction perpendicular to a plane of FIG. 9A. Next, in step S120, a through hole 13 and a trench 12 for cutting are formed on the aluminum plate by a method for embossing both sides of the aluminum plate in a direction that the aluminum plate is pressed by an embossing mold from above. Herein, through hole 13 is formed so as to be a part of a conical face. As shown in FIG. 9B, in a cross section of the aluminum plate after the embossing process, through hole 13 has a diameter gradually tapered in a downward direction. Next, in step S130, the aluminum plate is diced along trench 12 for cutting. Thus, in step S140, the plate-shaped reflector workpiece is completed. The reflector workpiece is formed into a plate shape which is long in a direction perpendicular to a plane of FIG. 9C, and includes a plurality of members formed as reflectors 5 by a dicing process in the direction in a subsequent step.

Figure 6:
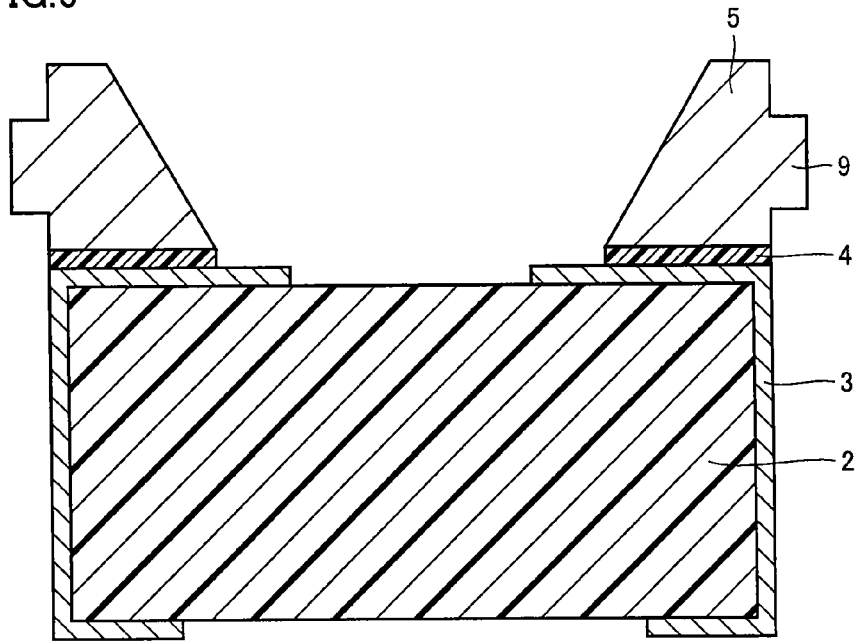
FIG. 6 schematically shows a step of joining a reflector workpiece.

As shown in FIG. 6, next, in step S40, the reflector workpiece is joined onto heat conduction type adhesive sheet 4. At this time, the reflector workpiece is formed into a plate shape which is long in a direction perpendicular to a plane of FIG. 6, and has a projection 9 which is a residue of a cutting margin divided along trench 12 for cutting by the dicing process in step S130.

Figure 7:
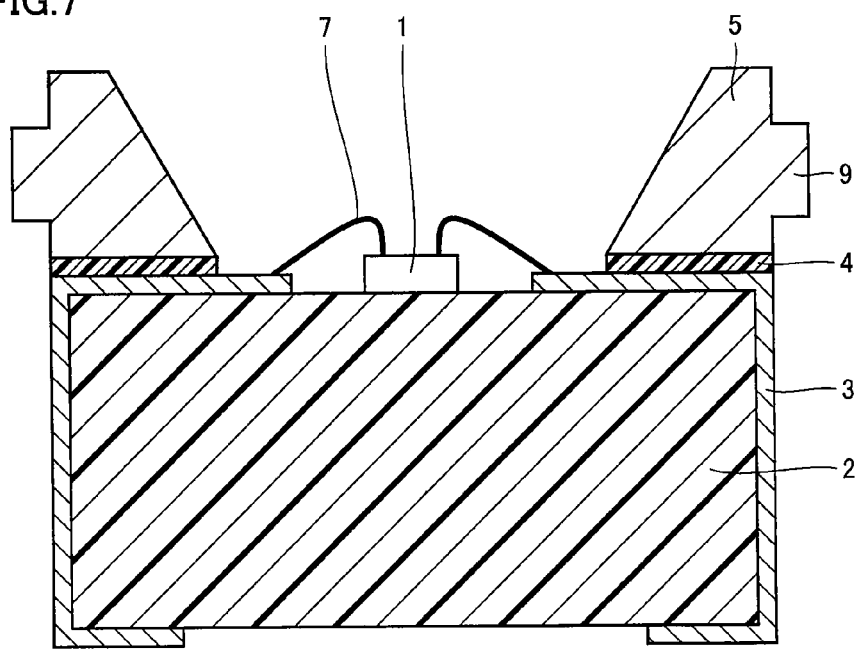
FIG. 7 schematically shows a step of fixedly bonding a semiconductor light emitting element.
Figure 8:
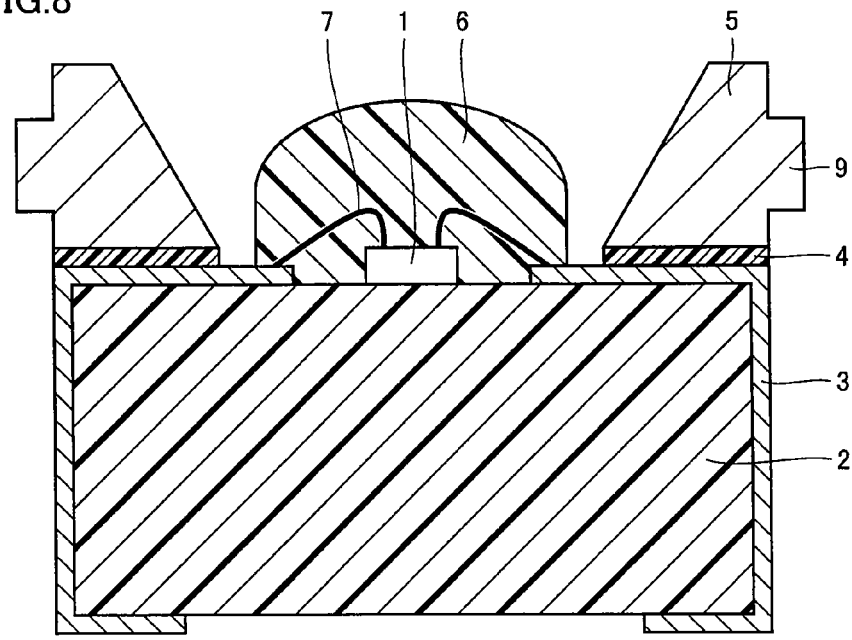
FIG. 8 schematically shows a step of applying a translucent resin.

As shown in FIG. 7, next, in step S50, semiconductor light emitting element 1 is fixedly bonded (mounted) onto the top face of base member 2 through a transparent epoxy resin. Semiconductor light emitting element 1 is fixedly bonded inside through hole 13 formed so as to be a part of the conical face of the reflector workpiece, so that the part of the conical face serves as an inner circumferential face of reflector 5. Thus, light emitted from semiconductor light emitting element 1 can be efficiently released to the outside. Subsequently, in step S60, an electrode of semiconductor light emitting element 1 is connected to a relevant bonding pad of conductor layer 3 through an electric conductive wire (a lead wire) 7 by a wire bonding process. As shown in FIG. 8, thereafter, in step S70, a translucent resin 6 containing a YAG-based fluorescent material is applied inside reflector 5 with the use of a dispenser.

Next, in step S80, the reflector workpiece and the base member aggregate are diced along the trench for cutting formed on the reflector workpiece. In the reflector workpiece which is long in a direction perpendicular to a plane of FIG. 8, the trench for cutting is not shown in FIG. 8 because it is formed on a cross section different from that shown in FIG. 8. Thus, in step S90, a single surface mounting type light emitting diode 10 shown in FIG. 1 is manufactured, which has a single base member 2 and a single reflector 5.

In the first embodiment, semiconductor light emitting element 1 is formed into a chip shape having a P-electrode and an N-electrode provided on a single side. However, the present invention is not limited to this structure. Alternatively, semiconductor light emitting element 1 may be formed into a chip shape having P-electrodes and N-electrodes provided on both sides. It is assumed herein that the electrode of semiconductor light emitting element 1 is provided on a side opposite to a side where semiconductor light emitting element 1 comes into contact with base member 2. If the surface of base member 2, to which semiconductor light emitting element 1 is fixedly bonded, is subjected to surface treatment such as gold plating or silver plating, the bonding of semiconductor light emitting element 1 to base member 2 becomes favorable. In the case of silver plating, a light reflectivity increases and light release efficiency improves. Moreover, the substrate for semiconductor light emitting element 1 may be either an insulator substrate or a conductor substrate. The material for semiconductor light emitting element 1 is not limited to the gallium nitride-based compound semiconductor. It is needless to say that semiconductor light emitting element 1 may be made of a ZnO (zinc oxide)-based compound semiconductor, an InGaAlP-based compound semiconductor or an AlGaAs-based compound semiconductor. In any cases, semiconductor light emitting element 1 can be mounted on base member 2.

Further, a plurality of semiconductor light emitting elements 1 can be mounted on base member 2. The mounting of the plurality of semiconductor light emitting elements 1 each emitting single-color light allows provision of a high power light source. It is needless to say that if semiconductor light emitting elements such as blue LED chips, green LED chips and red LED chips are mounted one by one or as many as each other, a light source to be obtained can perform toning of white light by adjustment of an amount of electric current to be fed to each LED chip.

Second Embodiment

Figure 10:
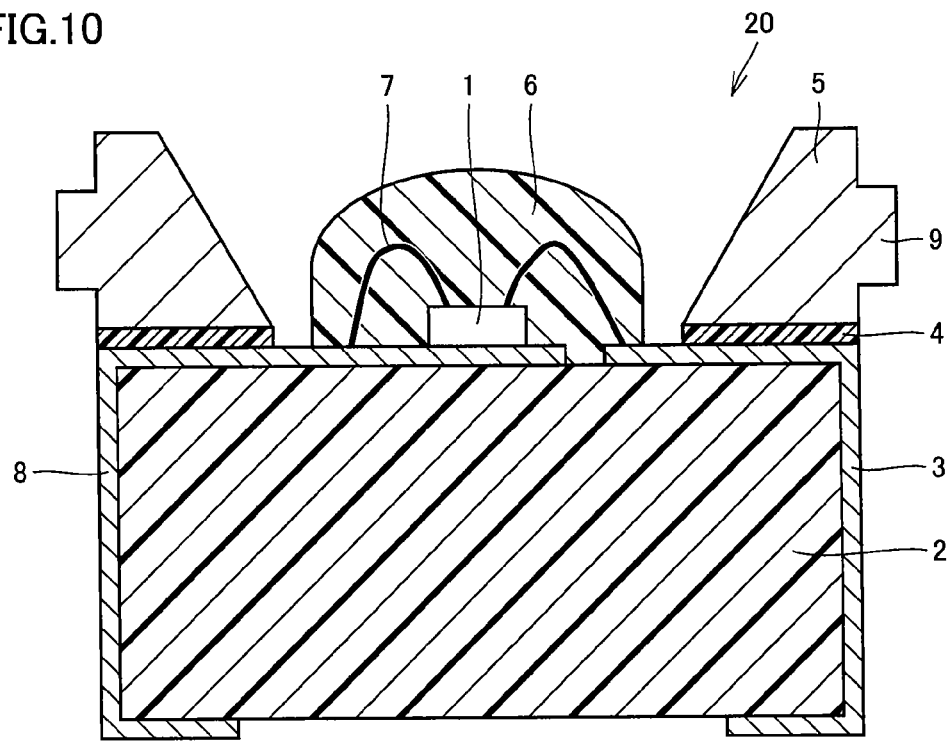
FIG. 10 schematically shows a part of a sectional structure of a surface mounting type light emitting diode according to a second embodiment of the present invention.

A surface mounting type light emitting diode 20 according to a second embodiment has a basically identical configuration to that of surface mounting type light emitting diode 10 according to the first embodiment. However, the second embodiment is different from the first embodiment in a point that a semiconductor light emitting element 1 is fixedly bonded as shown in FIG. 10.

Specifically, a base member 2 forming surface mounting type light emitting diode 20 is made of an alumina (a thickness: 0.8 mm). Conductor layers 3 and 8 each serving as a metal wiring pattern conductor are laminated on a top face of base member 2, in a form of a copper thin film (a thickness: 0.05 mm), for example. Semiconductor light emitting element 1 is fixedly bonded (mounted) onto conductor layer 8. A reflector 5 (a thickness: 1 mm) is made of Al, is formed into a bowl shape (a minimum inner diameter: approximately 2 mm, a maximum inner diameter: approximately 2.4 mm), and is joined to conductor layers 3 and 8 with a heat conductive silicone sheet (a thickness: 0.05 mm) interposed therebetween. A translucent resin 6 contains a BOS-based yellow fluorescent material.

As for a method for manufacturing surface mounting type light emitting diode 20, in step S50 shown in FIG. 3, semiconductor light emitting element 1 is fixedly bonded to conductor layer 8 which is a copper thin film (a thickness: 0.05 mm). Subsequently, in step S60, a first electrode of semiconductor light emitting element 1 is connected to a relevant bonding pad of conductor layer 3 and a second electrode of semiconductor light emitting element 1 is connected to a relevant bonding pad of conductor layer 8. Thereafter, in step S70, translucent resin 6 containing the BOS-based yellow fluorescent material is applied with the use of a dispenser.

A substrate for semiconductor light emitting element 1 may be either an insulator substrate or a conductor substrate. In a case where the substrate for semiconductor light emitting element 1 is made of a conductor, semiconductor light emitting element 1 may be fixedly bonded onto conductor layer 8, and the first electrode of semiconductor light emitting element 1 may be connected to the relevant bonding pad of conductor layer 3 by a wire bonding process. The remaining configurations of surface mounting type light emitting diode 20 and the remaining procedure of manufacturing surface mounting type light emitting diode 20 are equal to those described in the first embodiment; therefore, repetitive description thereof will not be given here.

Third Embodiment

Figure 11:
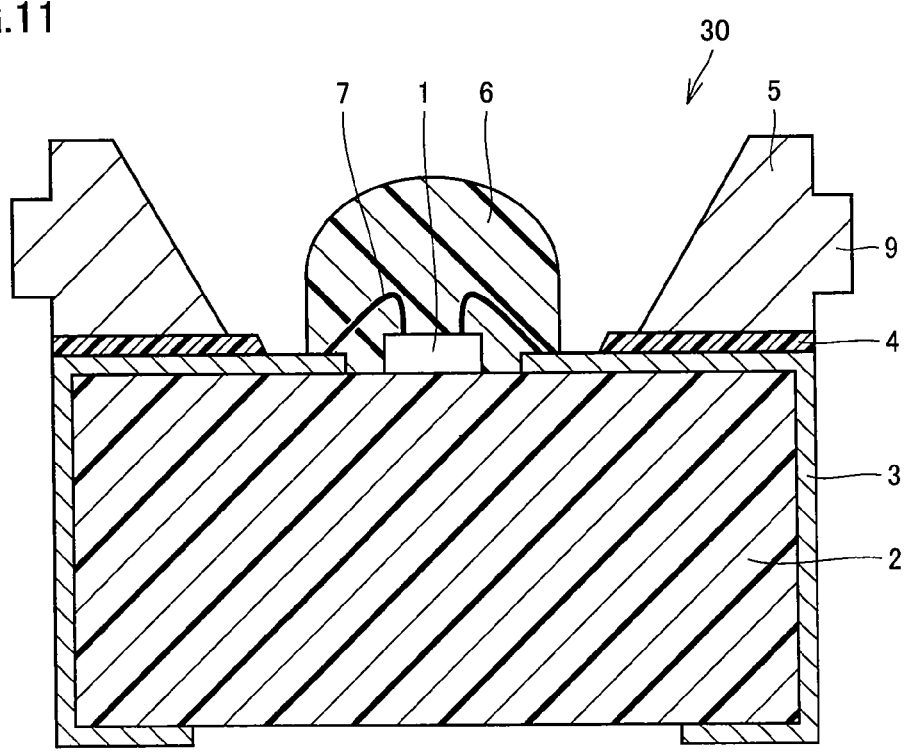
FIG. 11 schematically shows a part of a sectional structure of a surface mounting type light emitting diode according to a third embodiment of the present invention.

A surface mounting type light emitting diode 30 according to a third embodiment has a basically identical configuration to that of surface mounting type light emitting diode 10 according to the first embodiment. However, the third embodiment is different from the first embodiment in a point that a heat conduction type adhesive sheet 4 is configured as shown in FIG. 11.

Specifically, a base member 2 forming surface mounting type light emitting diode 30 is made of a glass epoxy (a thickness: 0.8 mm). A conductor layer 3 serving as a metal wiring pattern conductor is laminated on a top face of base member 2 in a form of a lamination of a copper thin film (a thickness: 0.04 mm) and a silver thin film (a thickness: 0.005 mm) formed by a silver plating method. A reflector 5 made of Al is formed into a bowl shape (a thickness: 1 mm, a minimum inner diameter: approximately 2.2 mm, a maximum inner diameter: approximately 2.6 mm), and is joined to conductor layer 3 with a heat conductive epoxy sheet (a thickness: 0.15 mm) interposed therebetween. A translucent resin 6 contains a BOS-based yellow fluorescent material.

Herein, the heat conductive epoxy sheet serving as a heat conduction type adhesive sheet 4 is formed at a position inward with respect to an inner circumferential wall of reflector 5. That is, heat conduction type adhesive sheet 4 and the side of reflector 5 brought into contact with heat conduction type adhesive sheet 4 are not necessarily equal in shape to each other. Heat conduction type adhesive sheet 4 may be formed at a position inward with respect to the inner circumferential wall of reflector 5. With the foregoing configuration of heat conduction type adhesive sheet 4, heat generated from semiconductor light emitting element 1 is transferred to reflector 5 via heat conduction type adhesive sheet 4 and conductor layer 3, and then is radiated from reflector 5 to the outside.

As for a method for manufacturing surface mounting type light emitting diode 30, in step S120 shown in FIG. 3, a through hole and a trench for cutting are formed on an aluminum plate by a method for embossing both sides of the aluminum in a direction that the aluminum plate is crushed by a mold from above. In step S70, translucent resin 6 containing the BOS-based yellow fluorescent material is applied with the use of a dispenser.

The remaining configurations of surface mounting type light emitting diode 30 and the remaining procedure of manufacturing surface mounting type light emitting diode 30 are equal to those described in the first embodiment; therefore, repetitive description thereof will not be given here.

Fourth Embodiment

Figure 12:
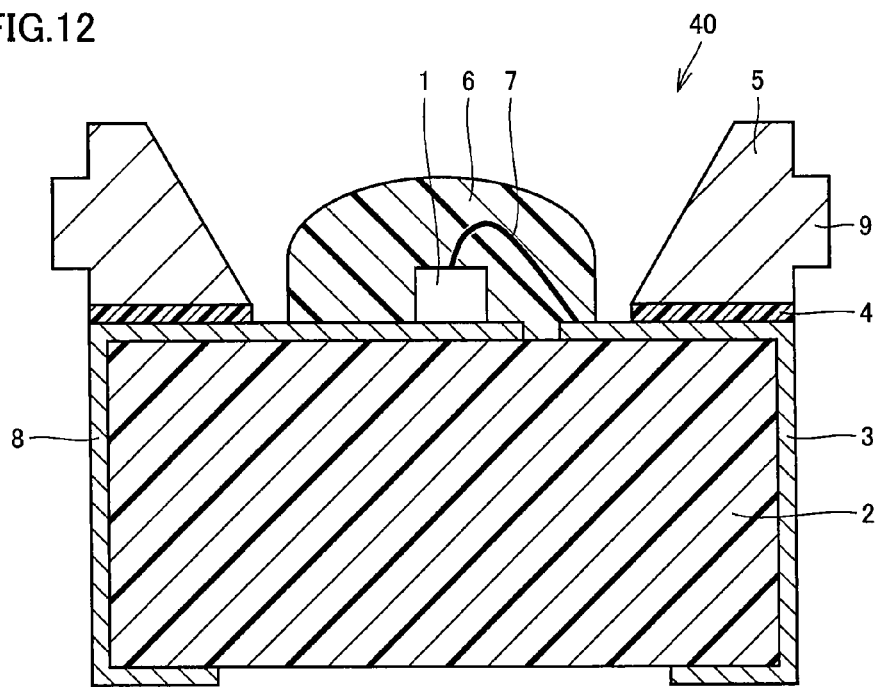
FIG. 12 schematically shows a part of a sectional structure of a surface mounting type light emitting diode according to a fourth embodiment of the present invention.

A surface mounting type light emitting diode 40 according to a fourth embodiment has a basically identical configuration to that of surface mounting type light emitting diode 20 according to the second embodiment. However, the fourth embodiment is different from the second embodiment in a point that a semiconductor light emitting element 1 is configured as shown in FIG. 12.

Specifically, semiconductor light emitting element 1 is a blue semiconductor light emitting element made of a gallium nitride-based compound semiconductor, Semiconductor light emitting element 1 has a bottom face on which one of a P-electrode and an N-electrode is provided and a top face on which the other one of the P-electrode and the N-electrode is provided. Herein, the bottom face is fixedly bonded onto a conductor layer 8 and the top face is opposite to the bottom face. The electrode provided on the top face of semiconductor light emitting element 1 is connected to a relevant bonding pad provided on a conductor layer 3 through an electric conductive wire 7.

A base member 2 forming surface mounting type light emitting diode 40 is made of an alumina (a thickness: 1 mm). Conductor layer 3 serving as a metal wiring pattern conductor is laminated on a top face of base member 2, in a form of a lamination of a copper thin film (a thickness: 0.025) mm and a gold thin film (a thickness: 0.008 mm) formed by a gold plating method. A reflector 5 (a thickness: 0.8 mm) is made of Al and is joined to conductor layer 3 with a heat conductive acryl sheet (a thickness: 0.08 mm) interposed therebetween. A translucent resin 6 contains a YAG-based fluorescent material.

As for a method for manufacturing surface mounting type light emitting diode 40, in step S50 shown FIG. 3, semiconductor light emitting element 1 is fixedly bonded to conductor layer 8 by a silver pasting process. Subsequently, in step S60, the electrode provided on the top face of semiconductor light emitting element 1 is connected to the relevant bonding pad of conductor layer 3. Thereafter, in step S70, translucent resin 6 containing the YAG-based fluorescent material is applied with the use of a dispenser.

The remaining configurations of surface mounting type light emitting diode 40 and the remaining procedure of manufacturing surface mounting type light emitting diode 40 are equal to those described in the first and second embodiments; therefore, repetitive description thereof will not be given here.

Fifth Embodiment

Figure 13:
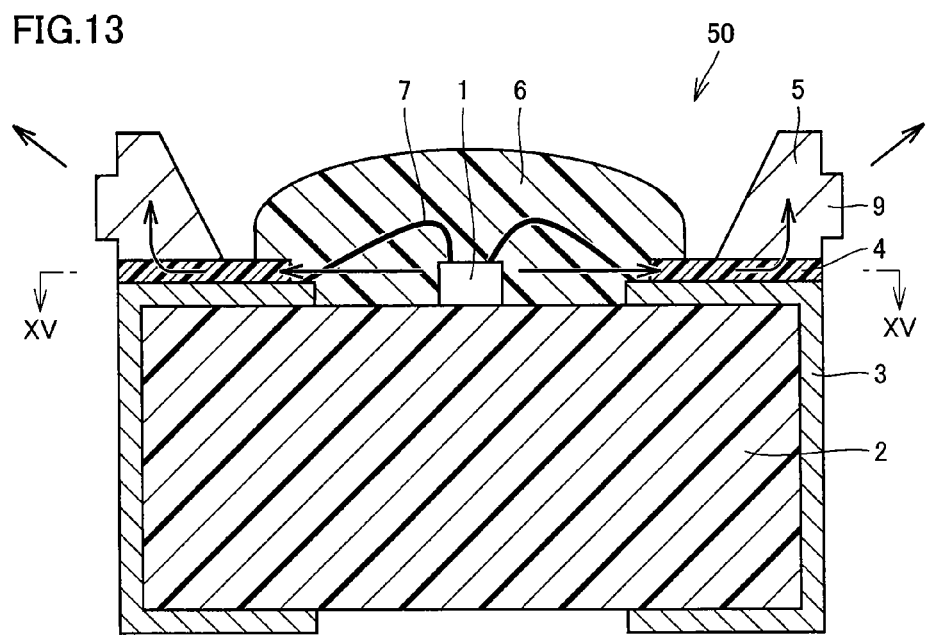
FIG. 13 schematically shows a part of a sectional structure of a surface mounting type light emitting diode according to a fifth embodiment of the present invention.
Figure 14:
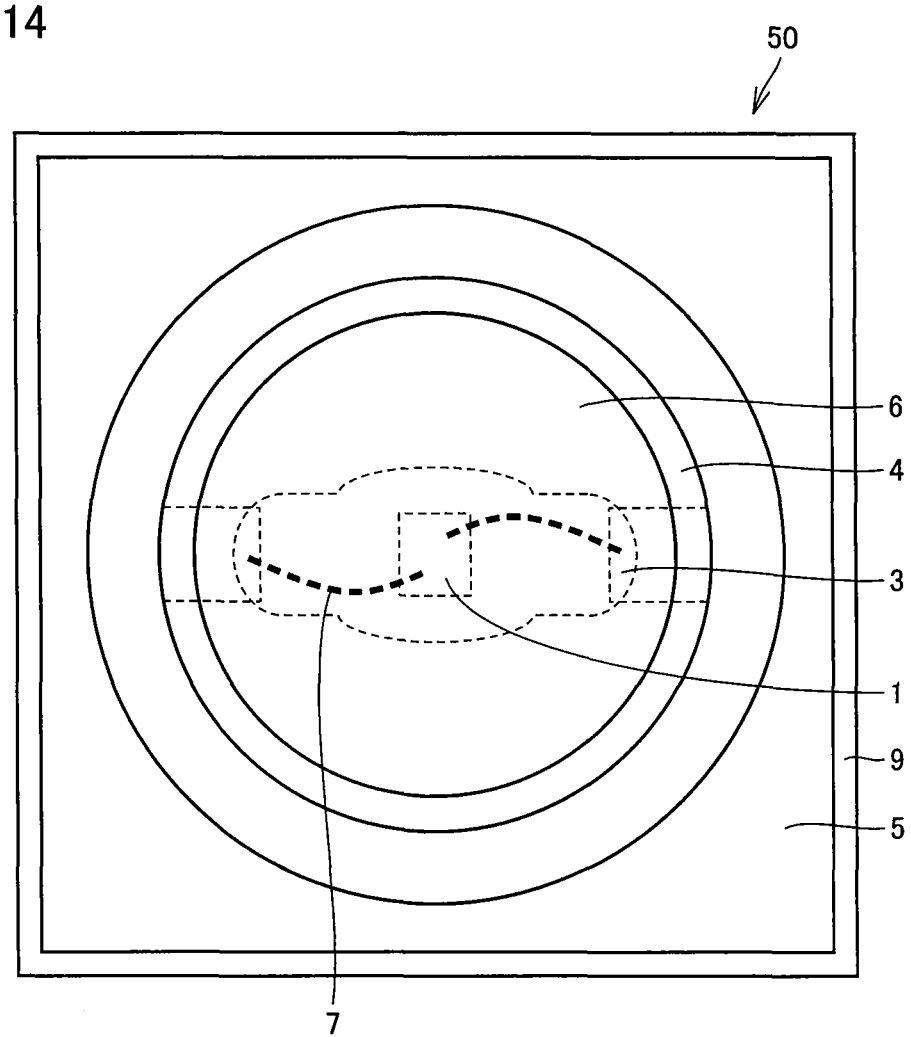
FIG. 14 is a plan view of the surface mounting type light emitting diode shown in FIG. 13.
Figure 15:
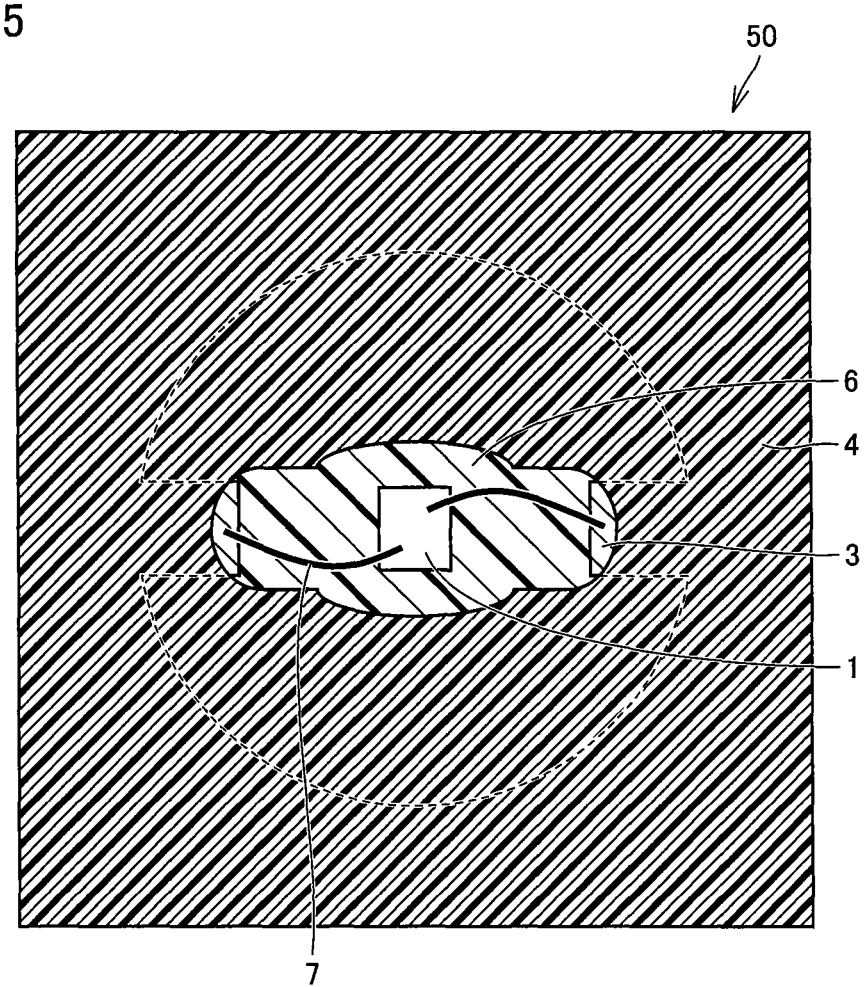
FIG. 15 is a schematic sectional view of the surface mounting type light emitting diode, taken along line XV-XV in FIG. 13.

A surface mounting type light emitting diode 50 according to a fifth embodiment has a basically identical configuration to that of surface mounting type light emitting diode 10 according to the first embodiment. However, the fifth embodiment is different from the first embodiment in a point that a heat conduction type adhesive sheet 4 is configured as shown in FIGS. 13 to 15.

Specifically, heat conduction type adhesive sheet 4 forming surface mounting type light emitting diode 50 is formed at a position inward with respect to an inner circumferential wall of a reflector 5. As shown in FIGS. 14 and 15, in other words, heat conduction type adhesive sheet 4 is formed except a region where a semiconductor light emitting element 1 is wire-bonded to a conductor layer 3, and comes into contact with a translucent resin 6. This configuration brings the following advantages. That is, as shown in FIG. 2, heat generated from semiconductor light emitting element 1 can be transferred to reflector 5 via base member 2, conductor layer 3 and heat conduction type adhesive sheet 4. As shown by an arrow mark in FIG. 13, additionally, heat radiated to translucent resin 6 can be transferred to reflector 5 via heat conduction type adhesive sheet 4. Accordingly, the heat generated from semiconductor light emitting element 1 can be efficiently radiated to the outside.

The remaining configurations of surface mounting type light emitting diode 50 and the remaining procedure of manufacturing surface mounting type light emitting diode 50 are equal to those described in the first embodiment; therefore, repetitive description thereof will not be given here.

Sixth Embodiment

Figure 16:
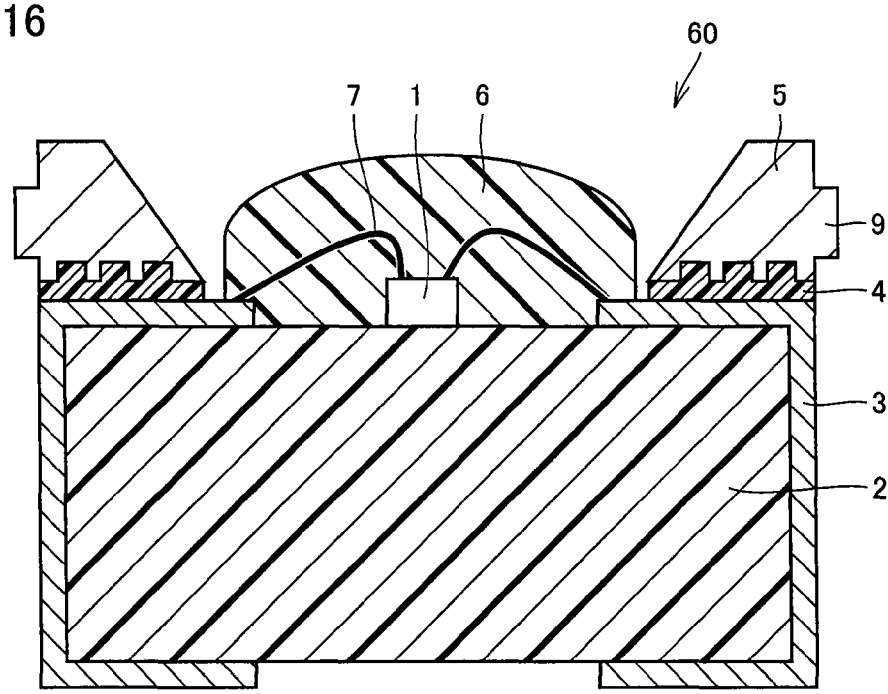
FIG. 16 schematically shows a part of a sectional structure of a surface mounting type light emitting diode according to a sixth embodiment of the present invention.

A surface mounting type light emitting diode 60 according to a sixth embodiment has a basically identical configuration to that of surface mounting type light emitting diode 10 according to the first embodiment. However, the sixth embodiment is different from the first embodiment in a point that a heat conduction type adhesive sheet 4 and a reflector 5 are configured as shown in FIG. 16.

Specifically, reflector 5 (a thickness: 1 mm) is made of Cu, and is formed into an irregular shape at a junction with heat conduction type adhesive sheet 4. A silver foil (a thickness: 0.008 mm) is laminated on an inner circumferential face, which is opposite to at least a semiconductor light emitting element 1, on the surface of reflector 5. As shown in FIG. 2, heat generated from semiconductor light emitting element 1 is transferred to reflector 5 via base member 2, conductor layer 3 and heat conduction type adhesive sheet 4. With the configuration according to the sixth embodiment, on the other hand, a junction area between heat conduction type adhesive sheet 4 and reflector 5 increases, which improves a heat conductivity from heat conduction type adhesive sheet 4 to reflector 5. Accordingly, the heat generated from semiconductor light emitting element 1 can be efficiently radiated to the outside. Further, a joining strength of reflector 5 can be enhanced.

Figure 17:
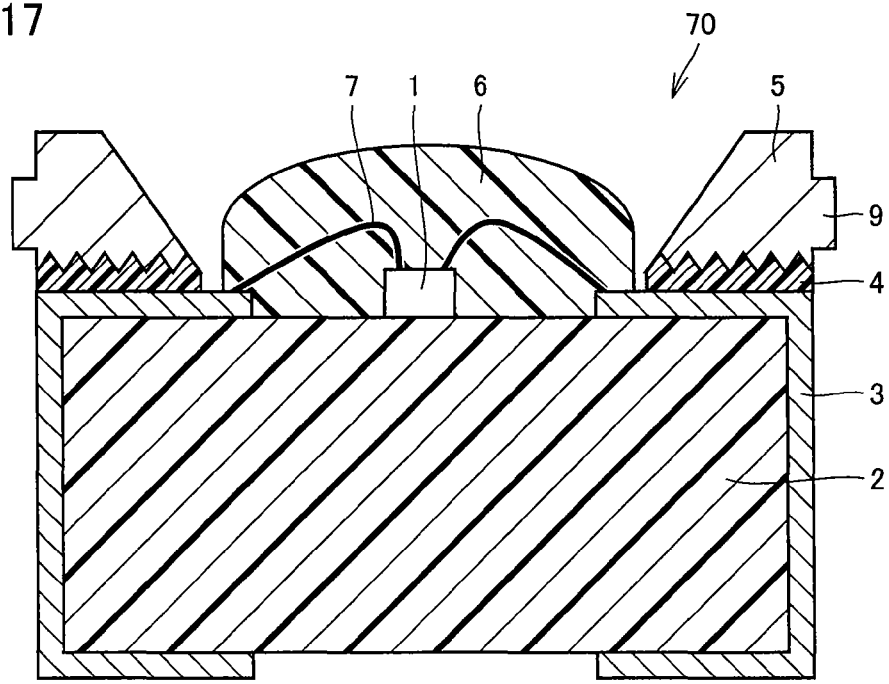
FIG. 17 schematically shows a part of a modified sectional structure of the surface mounting type light emitting diode according to the sixth embodiment.

As shown in FIG. 17, reflector 5 is formed into a shape having sawtooth notches at the junction with heat conduction type adhesive sheet 4. Like the configuration shown in FIG. 16, this configuration brings the following advantages. That is, the increase in junction area between heat conduction type adhesive sheet 4 and reflector 5 improves the heat conductivity from heat conduction type adhesive sheet 4 to reflector 5. Thus, the heat generated from semiconductor light emitting element 1 can be efficiently radiated to the outside. Further, the joining strength of reflector 5 can be enhanced. It is to be noted that the remaining configurations of surface mounting type light emitting diodes 60 and 70 and the remaining procedures of manufacturing surface mounting type light emitting diodes 60 and 70 are equal to those described in the first embodiment; therefore, repetitive description thereof will not be given here.

In the first to fifth embodiments, as one example, reflector 5 is made from a single aluminum plate material. Alternatively, reflector 5 may be made from a combination of various kinds of metal. For example, on a surface of a metal material, different metal is laminated by a plating process. The metal material for reflector 5 is not limited to Al. Alternatively, reflector 5 may be made of one of Cu, Fe, Mg and the like each of which is excellent in heat radiation performance and workability, or a complex thereof. More preferably, reflector 5 is made of a single material because of the following reason. As shown in FIG. 9, that is, reflector 5 can be readily fabricated and the productivity can be improved. In the case where reflector 5 is made of the single material, this single material may be not only one kind of metal, but also an alloy.

Figure 18:
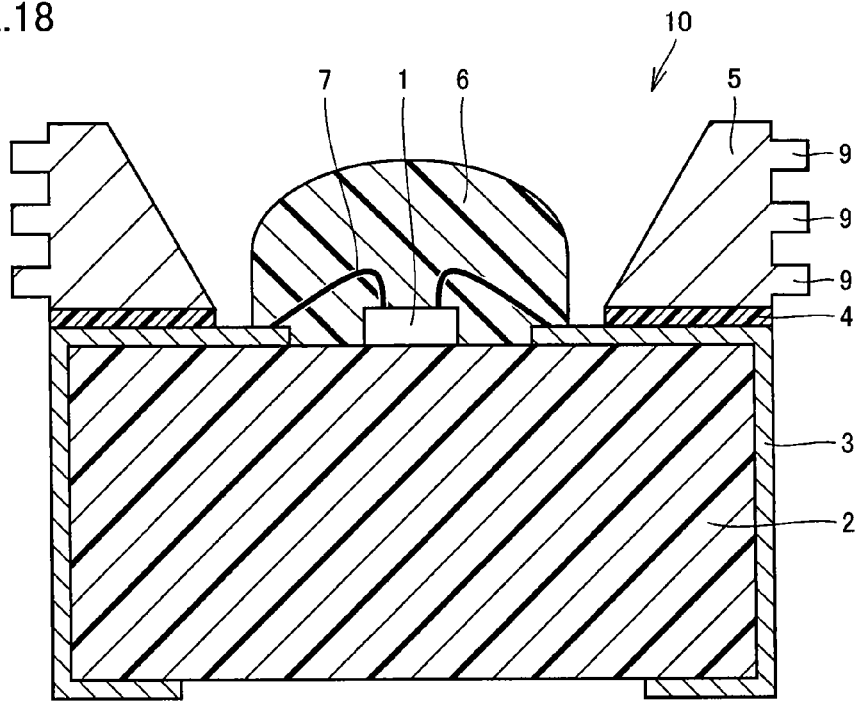
FIG. 18 schematically shows a part of a sectional structure of a surface mounting type light emitting diode in which a shape of a reflector is modified.
Figure 19:
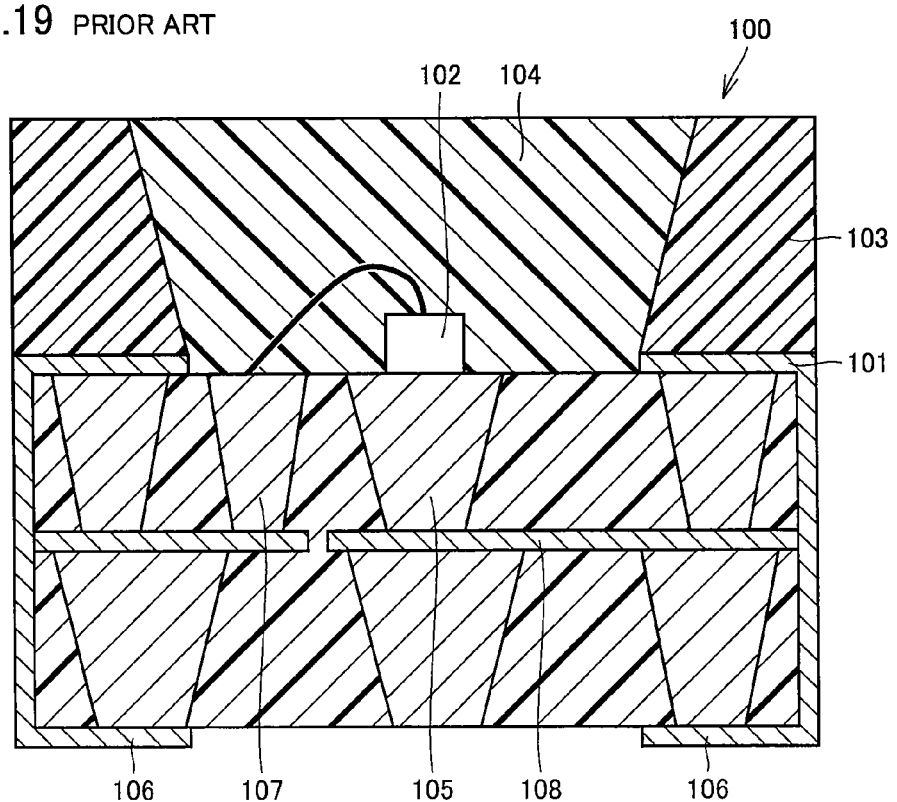
FIG. 19 is a schematic sectional view showing one configuration example of a conventional surface mounting type light emitting diode.
Figure 20:
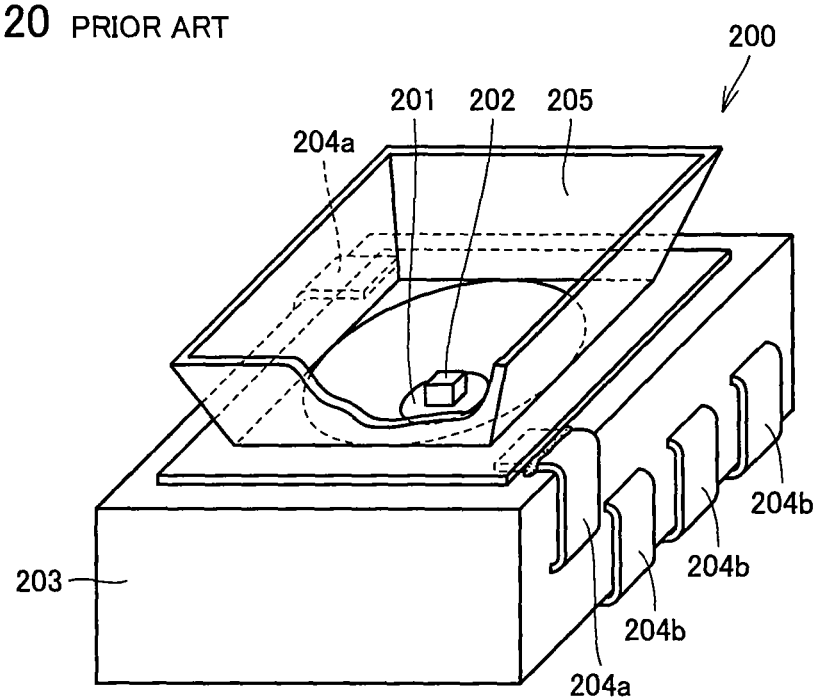
FIG. 20 is a perspective view showing another configuration example of a conventional surface mounting type light emitting diode.

As shown in FIG. 18, with regard to the shape of reflector 5, a portion other than the inner circumferential face serving as a light reflection face of reflector 5 is formed into an irregular shape, like projection 9. That is, reflector 5 may be formed into a shape like a heat radiation fin. Thus, radiation of heat from reflector 5 to the outside is further accelerated, so that the heat radiation performance of reflector 5 can be further improved. The shape of the light reflection face of reflector 5 is not limited to a conical shape. For example, reflector 5 may be formed such that the light reflection face is a part of a spherical face or a paraboloidal face. In this case, light emitted from semiconductor light emitting element 1 can be released efficiently.

Moreover, the material for base member 2 is not limited to the glass epoxy as described in the first embodiment or the alumina as described in the second embodiment, and examples thereof may include other ceramic materials such as AlN, resin materials such as an epoxy and a polyimide, and a complex of these materials.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A surface mounting type light emitting diode comprising:

an electrically insulating base member;

a semiconductor light emitting element having a bottom face bonded to a top face of said base member; and a metallic reflector disposed over and joined to the top face of said base member with an electrically insulating adhesive sheet interposed therebetween, so as to surround said semiconductor light emitting element, wherein said reflector has an outer peripheral face comprising an upper portion, a lower portion and a horizontal projection disposed between said upper portion and said lower portion, the horizontal projection having a width smaller than a width of said outer peripheral face, the horizontal projection extending outward beyond both said upper portion and said lower portion and protruding outward beyond an outer peripheral face of said electrically insulating base member including wiring formed thereon.

2. The surface mounting type light emitting diode according to claim 1, wherein said reflector has a plurality of projections each equal to said projection.

3. The surface mounting type light emitting diode according to claim 1, wherein said base member is made of at least any one of a glass epoxy, an alumina, an epoxy, a polyimide and AlN, or a complex thereof.

4. The surface mounting type light emitting diode according to claim 1, wherein said reflector is made of at least any one of Al, Cu, Fe and Mg, or a complex thereof.

5. The surface mounting type light emitting diode according to claim 1, further comprising:
a translucent resin provided on said base member so as to cover said semiconductor light emitting element and to come into no contact with said reflector.

6. The surface mounting type light emitting diode according to claim 1, further comprising:
a translucent resin provided on said base member so as to cover said semiconductor light emitting element and to come into no contact with said reflector, wherein
said translucent resin contains a fluorescent material excited by light released from said semiconductor light emitting element to emit light longer in wavelength than said light released from said semiconductor light emitting element.

7. The surface mounting type light emitting diode according to claim 1, wherein
said semiconductor light emitting element is a blue semiconductor light emitting element made of a gallium nitride-based compound semiconductor,
the surface mounting type light emitting diode further comprising:
a translucent resin provided on said base member so as to cover said blue semiconductor light emitting element and to come into no contact with said reflector, wherein
said translucent resin contains a fluorescent material excited by light released from said blue semiconductor light emitting element to emit yellow light.

8. The surface mounting type light emitting diode according to claim 1, further comprising:
a plurality of semiconductor light emitting elements each equal to said semiconductor light emitting element.

9. The surface mounting type light emitting diode according to claim 1, wherein
said electrically insulating adhesive sheet is a heat conduction type adhesive sheet having a heat conductivity of at least 1.0 W/m·K.

10. The surface mounting type light emitting diode according to claim 9, wherein
said heat conduction type adhesive sheet is made of at least any one of a heat conductive silicone, a heat conductive acryl and a heat conductive epoxy, or a complex thereof.

11. The surface mounting type light emitting diode according to claim 1, further comprising:
a translucent resin provided on said base member so as to cover said semiconductor light emitting element and to come into no contact with said reflector, wherein
said adhesive sheet is a heat conduction type adhesive sheet having a heat conductivity of at least 1.0 W/m·K, and
said translucent resin and said heat conduction type adhesive sheet come into contact with each other.

12. The surface mounting type light emitting diode according to claim 1, wherein
said reflector has an inner circumferential face formed into a part of any one of a conical face, a spherical face and a paraboloidal face.

13. The surface mounting type light emitting diode according to claim 1, wherein
at least the top face of said base member, to which said semiconductor light emitting element is bonded, is gold plated or silver plated.

14. The surface mounting type light emitting diode according to claim 1, wherein
the top face of said base member is gold plated or silver plated to form a conductor layer electrically connected to said semiconductor light emitting element.

15. The surface mounting type light emitting diode according to claim 1, wherein
said reflector has an irregular bonding face to said base member.

16. The surface mounting type light emitting diode according to claim 1, wherein
said reflector has a sawtoothed bonding face to said base member.

17. The surface mounting type light emitting diode according to claim 1, wherein
said adhesive sheet extends inwardly with respect to an inner circumferential face of said reflector.

\* \* \* \* \*